(12) United States Patent
Takeuchi et al.

(10) Patent No.: US 8,439,690 B2
(45) Date of Patent: May 14, 2013

(54) CONNECTOR

(75) Inventors: Akihito Takeuchi, Tokyo (JP); Hitoshi Mizoguchi, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 0 days.

(21) Appl. No.: 13/144,164

(22) PCT Filed: Jan. 15, 2010

(86) PCT No.: PCT/JP2010/050383
§ 371 (c)(1),
(2), (4) Date: Jul. 12, 2011

(87) PCT Pub. No.: WO2010/082616
PCT Pub. Date: Jul. 22, 2010

(65) Prior Publication Data
US 2011/0269318 A1   Nov. 3, 2011

(30) Foreign Application Priority Data
Jan. 15, 2009 (JP) .................... 2009-007099

(51) Int. Cl.
*H01R 12/00* (2006.01)
(52) U.S. Cl.
USPC ........................................ 439/66
(58) Field of Classification Search .......... 439/91, 439/66
See application file for complete search history.

(56) References Cited

U.S. PATENT DOCUMENTS

| 6,690,564 | B1 | 2/2004 | Haruta et al. | |
| 7,318,729 | B2 * | 1/2008 | Sato et al. | 439/66 |
| 7,618,267 | B2 * | 11/2009 | Konno et al. | 439/91 |

FOREIGN PATENT DOCUMENTS

| EP | 1624309 A1 | 2/2006 |
| EP | 1633019 A1 | 3/2006 |
| EP | 1848255 A1 | 10/2007 |
| JP | 2000-082512 A | 3/2000 |
| JP | 2001-266975 A | 9/2001 |
| JP | 2003-031027 A | 1/2003 |
| JP | 2003-163047 A | 6/2003 |

OTHER PUBLICATIONS

International Search Report for PCT Patent App. No. PCT/JP2010/050383 (Feb. 9, 2010).
Supplementary European Search Report for EP Patent App. No. 10731285.2 (Oct. 29, 2012).

* cited by examiner

*Primary Examiner* — Phuong Dinh
(74) *Attorney, Agent, or Firm* — Cermak Nakajima LLP; Tomoko Nakajima

(57) ABSTRACT

The present invention provides a technique that is easy for soldering fixture to a printed circuit board and is easy to handle. Regarding a connector having an insulating base portion and a conductive portion, in at least one direction of a surface to which the conductive portion is exposed, a metal plate extending from a side constituting the surface to another side not adjacent to the side is included. The metal plate can be fixed to a circuit board with solder, and deformation of the connector can be made less likely to occur.

11 Claims, 9 Drawing Sheets

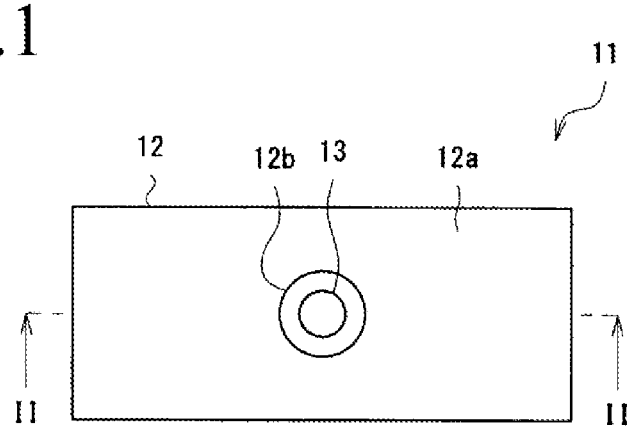
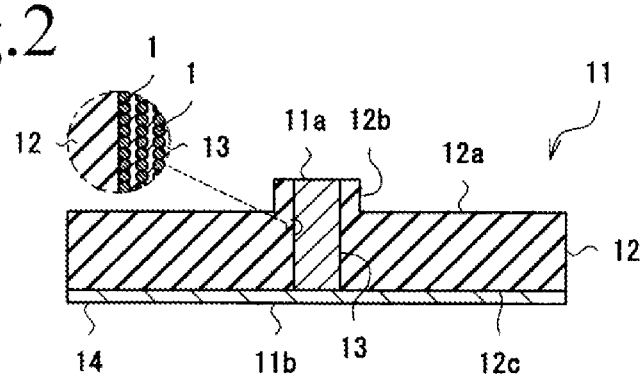
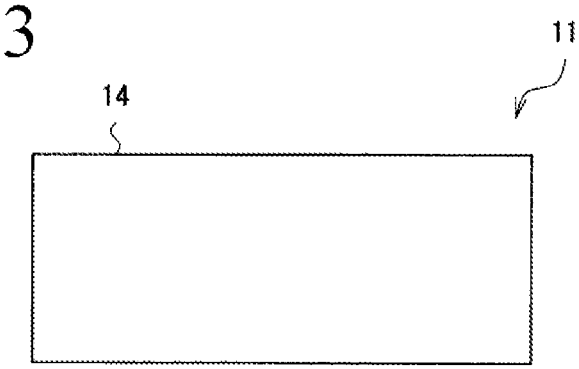

CONNECTOR

This application is a national phase entry under 35 U.S.C. §371 of PCT Patent Application No. PCT/JP2010/050383, filed on Jan. 15, 2010, which claims priority under 35 U.S.C. §119 to Japanese Patent Application No. 2009-007099, filed Jan. 15, 2009, both of which are incorporated by reference.

TECHNICAL FIELD

The present invention relates to a connector that is used for electrically connecting printed circuit boards for use in an electronic device, a printed circuit board and an electronic component, or a printed circuit board and a casing that is conductive with the electronic device, and that is suitable for the purpose of mounting in a reflow oven.

BACKGROUND ART

There is known a connector sheet with which an electrical connection is made between printed circuit boards or between a printed circuit board and an electronic component, grounding is made between a printed circuit board and a casing of an electronic device having conductivity, or the like. This connector sheet has a configuration in which a conductive portion is provided in an insulating elastic sheet made of a rubber elastic body such that the conductive portion passes through the insulating elastic sheet in a thickness direction thereof.

Electronic components such as a resistor, a capacitor, an integrated circuit (IC), and a large-scale integrated circuit (LSI) are mounted on a printed circuit board using a reflow oven. This is a mounting method in which electronic components are arranged on a solder paste applied in a circuit pattern of the printed circuit board and the solder is melted in a reflow oven, so that the circuit pattern and the electronic components are electrically connected and fixed in place. There is known a connector sheet in which heat weldable powder that is heat weldable to a metal foil of a printed circuit board is formed in an exposed manner on at least one surface of an elastic sheet in order to mount the connector sheet together with other electronic components in a reflow oven (PTL 1).

CITATION LIST

Patent Literature

PTL 1: Japanese Unexamined Patent Application Publication No. 2001-266975

SUMMARY OF INVENTION

Technical Problem

The connector sheet of PTL 1 can be mounted together with other electronic components onto a printed circuit board in a reflow oven. The elastic sheet, however, is thin and soft and is irregularly deformed without tactile feedback, and therefore is difficult to handle. The heat weldable powder is hard, and therefore the elastic sheet is likely to bend around the heat weldable powder. Further, there is a problem in that the elastic sheet is easily removed when being attracted and transported by an pick-up portion of an automatic mounting machine.

If a recess for attachment of heat weldable powder is provided in advance in a connector, and the heat weldable powder is attached onto the recess, this involves a problem in that work of attaching solder in advance onto the recess is required, and a problem in that there are limitations on positioning of the solder.

Against the above background, the present invention has been made. That is, an object of the present invention is to provide a technique that allows for soldering fixture to a printed circuit board and is easy to handle.

Solution to Problem

To achieve the above object, the present invention is constructed as follows.

That is, there is provided a connector including an insulating base portion made of a rubber elastic body or made up of the rubber elastic body and a resin material, and a conductive portion passing through the base portion in a thickness direction of the base portion and being made of a conductive particle or a metal pole or made up of both the conductive particle and the metal pole, the conductive portion having one end and the other end brought into contact with members to be connected, respectively, to conductively connect the members to each other, the connector includes, in at least one direction of a surface to which the conductive portion is exposed, a metal plate extending from a side constituting the surface to another side not adjacent to the side.

In at least one direction of a surface to which the conductive portion is exposed, included is the metal plate extending from a side constituting the surface to another side not adjacent to the side. The metal plate that appears in at least one of one direction and the other direction of the base portion can face or be in contact with at least one of members to be connected. The use of this metal plate enables the connector to be fixed, with solder, to members to be connected.

Moreover, this metal plate extends from a side constituting the surface of the base portion to another side that is not adjacent to the side, and therefore the stiffness of the base portion enables the base portion to be less likely to be deformed, making it possible to facilitate handling of the base portion. Thus, bending during assembling a connector by means of hand working, dropping-out from an automatic transport machine during transporting the connector using the automatic transport machine, and the like can be made less likely to occur.

For example, in the case of a connector in which a base portion rectangular in plan view has a conductive portion passing through front and back surfaces of the base portion, a metal plate is provided on at least one of the front and back surfaces of the base portion, and the metal plate is provided across opposite sides of a rectangular surface. As a result, the base portion is less likely to be deformed to such an extent that the metal plate bends, so that the deformation of the base portion can be bending deformation with a bending line across opposite sides, as with the metal plate. Therefore, irregular deformation of a base portion that occurs in a connector according to a conventional technique can be avoided. That is, if, along a direction of shorter sides extending from a longer side to a longer side of the rectangular surface, a metal plate is provided at both ends of the longer side, the base portion is less likely to be deformed in such a manner that the shorter side bends, so that deformation can be such that the longer side bends. In this way, a metal plate can be used as a shape-retaining sheet, and therefore a shape-retaining sheet need not be provided in addition to the metal plate. This can decrease the number of members included in the connector.

The base portion may include an elastic sheet made of a rubber elastic body. This enables the base portion to be elastically deformed, so that the connector can be mounted in a pressure contact state. Despite of being an elastic sheet, the base portion includes a metal plate, and therefore allows the connector to be fixed, with solder, to members to be connected.

The insulating base portion may include a resin material. Resin has a larger stiffness than a rubber elastic body, and therefore if part of the base portion is formed of a resin material, this enables the base portion to be less likely to be deformed, making it possible to facilitate handling of the connector. For example, if the rubber elastic body is provided with a resin film, the resin film can be utilized as a shape-retaining sheet to enhance the shape retaining property of the metal plate or to complement the shape retaining property of the metal plate, so that, because of the stiffness of the resin film, the connector is less likely to be deformed and is easy to handle.

The conductive portion may be made of a conductive particle or a metal pole or made up of both the conductive particle and the metal pole. If the whole or part of the conductive portion is formed of the metal pole, among them, this enables the conductivity of the conductive portion to be enhanced compared to the case where the conductive portion is formed of a conductive particle, so that a large current with driving control other then signals can pass through the conductive portion. Conversely, if the conductive portion is formed of a conductive particle, using magnetic particles having conductivity allows orientation to be easily performed, and allows the size, density, position, and the like of the conductive portion in the base portion can be easily changed. Thus, various types of connectors can easily be formed.

A surface exposed outside of the conductive portion may be formed to project beyond a surface of the metal plate. If the surface exposed outside of the conductive portion is formed to project beyond the surface of the metal plate, the projecting portion can make up for the thickness of solder entering between the metal plate and a member to be connected, so that poor contact between the connector and the member to be connected can be reduced.

The metal plate may extend on a side surface of the base portion. In this way, the connector can be fixed by applying solder onto a side surface of the base portion. Fixing the connector in place by using solder can be made easier. The area of a portion where solder may be applied expands, which can reduce an fixed failure of the connector.

Moreover, the metal plate forms bending corner portions, and therefore the stiffness of the metal plate can be enhanced. Thus, the base portion can further be made less likely to be deformed, and it is possible to facilitate handling of the connector.

The metal plate may include a projecting portion projecting into the base portion that separates adjacent conductive portions from each other. If such a metal plate is fixed in place with solder so as to be connected to the ground provided on the printed circuit board, the conductive portions separated by the projecting portion of the metal plate are also electromagnetically separated. This enables signals flowing through the conductive portions to be less likely to be mutually affected. Conductive connections for high-frequency applications can be realized.

Moreover, with the projecting portion, the stiffness of the metal plate can be enhanced. Thus, the base portion can be made less likely to be deformed, and it is possible to facilitate handling of the connector.

Advantageous Effects of Invention

With the connector of the present invention, through the use of the metal plates, the connector can be fixed, with solder, to members to be connected. Further, the stiffness of a shape-retaining sheet enables the base portion to be less likely to be deformed, making it possible to facilitate handling of the base portion. Thus, it is possible to cause bending of the connector and poor transportation using an automatic transport machine to be less likely to occur.

BRIEF DESCRIPTION OF DRAWINGS

FIG. 1 is a plan view illustrating a connector of a first embodiment.

FIG. 2 is a cross-sectional view taken along the line II-II of FIG. 1.

FIG. 3 is a bottom view illustrating the connector of the first embodiment.

DESCRIPTION OF EMBODIMENTS

With reference to the drawings, several examples of embodiments of the present invention will be described in more detail. Note that, for configurations, materials, and manufacturing methods that are common to the following embodiments, overlapping descriptions will be omitted. Herein, for the sake of convenience of description, the upper and lower sides of a connector are defined corresponding to the upper and lower sides of the drawings; however, the upper and lower sides can be vertically flipped or rotated a half-turn, depending upon how they are used in practice.

First Embodiment [FIG. 1 to FIG. 5]

Figure 4:
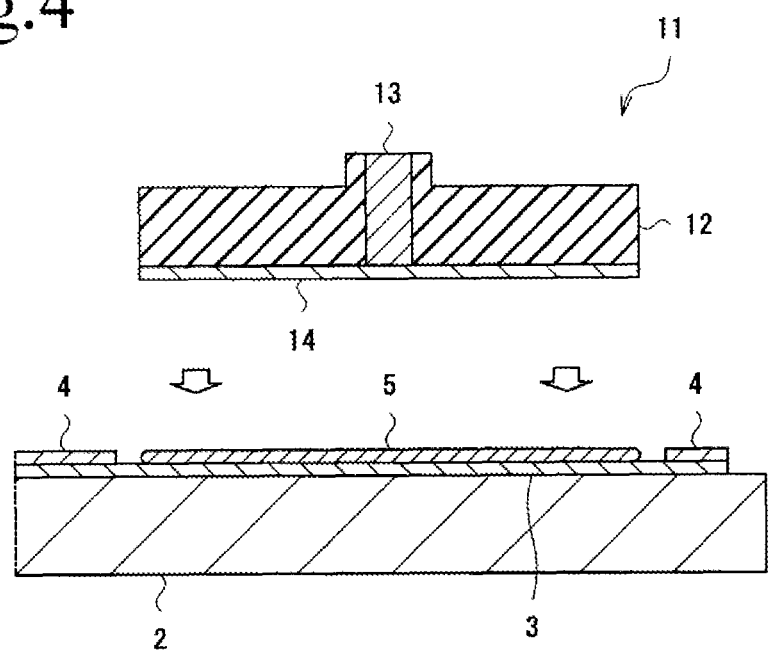
FIG. 4 is an explanatory view illustrating a method of mounting the connector in the first embodiment.
Figure 5:
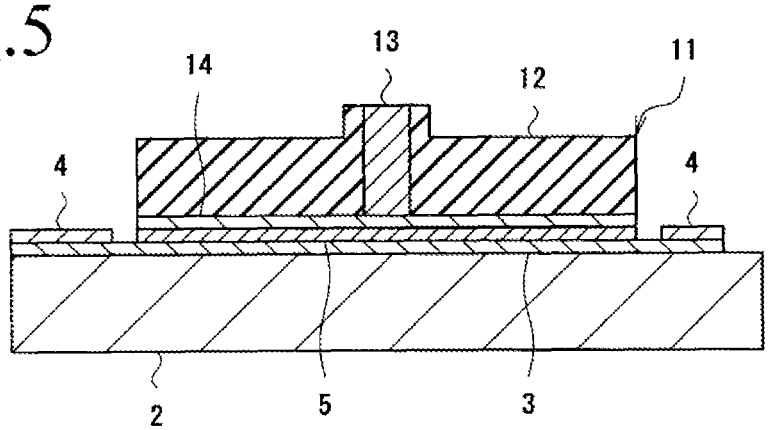
FIG. 5 is an explanatory view illustrating a state in which the connector is mounted in the first embodiment.

A connector 11 of a first embodiment is illustrated in FIG. 1 to FIG. 5. FIG. 1 is a plan view of the connector 11, FIG. 2 is a cross-sectional view taken along the line II-II of the connector 11, FIG. 3 is a bottom view of the connector 11, FIG. 4 is an explanatory view illustrating a method of mounting the connector 11, and FIG. 5 is an explanatory view illustrating a state in which the connector 11 is mounted. The connector 11 includes a base portion 12, a conductive portion 13, and a metal plate 14.

The base portion 12 is an "elastic sheet" made of an insulating rubber elastic body and is formed so as to be rectangular in plan view. The base portion 12 has in the inside thereof one conductive portion 13 whose thickness direction is a conductive direction. On a top surface 12a of the base portion 12 formed in such a fashion, a cylinder-shaped connection projection 12b projecting in the thickness direction of the base portion 12 is provided, and one end of the conductive portion 13 is exposed at an end surface of the connection projection 12b. A bottom surface 12c of the base portion 12 is formed into a flat surface.

The conductive portion 13 is formed such that particulate magnetic conductors 1 are oriented, by the magnetic field orientation to be described later, in such a manner as to be linked together. One end of the conductive portion 13 is exposed at an end surface of the connection projection 12b of the base portion 12 to form an upper electrode surface 11a of the connector 11, and the other end together with the bottom surface 12c of the base portion 12 forms a flat surface.

The metal plate 14 is formed into a rectangular shape, which is approximately the same shape as the base portion 12 in plan view, and adheres, as a "shape-retaining sheet" for the base portion 12, in such a manner as to cover the whole bottom surface 12c of the base portion 12. The metal plate 14 is in contact with the other end of the conductive portion 13 and forms a lower electrode surface 11b of the connector 11.

Materials for components of the connector 11 will be described here. Note that the following description is common to embodiments to be described later.

As materials for a rubber elastic body used for the base portion 12, insulating thermosetting rubber and insulating thermoplastic elastomer can be used. Examples of the thermosetting rubber include silicone rubber, natural rubber, isoprene rubber, butadiene rubber, acrylonitrile-butadiene rubber, 1,2-polybutadiene, styrene butadiene rubber, chloroprene rubber, nitrile rubber, butyl rubber, ethylene propylene rubber, chlorosulfonated polyethylene, polyethylene rubber, acrylic rubber, epichlorohydrin rubber, fluororubber, and urethane rubber. Among them, silicone rubber that is excellent in mold workability, electrical insulating properties, weathering properties, and the like is preferably used. The thermoplastic elastomer includes styrene thermoplastic elastomer, olefin thermoplastic elastomer, ester thermoplastic elastomer, urethane thermoplastic elastomer, amide thermoplastic elastomer, vinyl chloride thermoplastic elastomer, fluoro thermoplastic elastomer, ion cross-linked thermoplastic elastomer, and the like.

As the connector 11 of the present embodiment, in cases where the conductive portion 13 is formed of the magnetic conductors 1 linked together by the magnetic field orientation, an insulating rubber elastic body obtained by curing liquid rubber, or a heat fusible, insulating rubber elastic body is used. Examples of the rubber elastic body obtained by curing liquid rubber include silicone rubber, natural rubber, isoprene rubber, butadiene rubber, 1,2-polybutadiene, styrene butadiene rubber, nitrile rubber, butyl rubber, ethylene propylene rubber, and urethane rubber. The heated meltable, insulating rubber elastic body includes styrene thermoplastic elastomer, olefin thermoplastic elastomer, ester thermoplastic elastomer, urethane thermoplastic elastomer, amide thermoplastic elastomer, vinyl chloride thermoplastic elastomer, fluoro thermoplastic elastomer, ion cross-linked thermoplastic elastomer, and the like. The viscosity of liquid rubber or the viscosity during heating and fusing needs to be a viscosity that allows the contained magnetic conductor 1 to be moved by a magnetic field; the viscosity is preferably 1 Pa·s to 250 Pa·s, and more preferably 10 Pa·s to 50 Pa·s.

The conductive portion 13 is made of the magnetic conductor 1 as in the present embodiment, or a conductive rubber elastic body in which conductive particles are dispersed in an insulating rubber elastic body. Among them, examples of the materials for the magnetic conductor 1 include nickel, cobalt, iron, ferrite; alloys of these; and particle-like shapes, fiber-like shapes, strip-like shapes, fine line-like shapes, and other shapes of these are used. Further, metal, resin, or ceramic having good electric conductivity coated with a magnetic conductor, or a magnetic conductor coated with metal having good electric conductivity can be used. The metals having good electric conductivity include gold, silver, platinum, aluminum, copper, iron, palladium, chromium, stainless steel, and the like. The average particle diameter of the magnetic conductor 1 of from 1 μm to 200 μm can facilitate formation of a linkage state by the magnetic field orientation, enabling formation of the conductive portion 13 with high efficiency. Examples of the conductive particles used for the conductive rubber elastic body include carbon black and metals.

As the metal plate 14, a roll-formed metal plate or an electrolytically formed metal plate is used. Examples of the metal include gold, silver, copper, iron, nickel, and alloys of these. In terms of adhesive properties and workability for soldering, a metal plate using gold, copper, or the like, or a metal plate obtained by plating of copper or nickel with gold or silver is preferable. The thickness of the metal plate 14 formed in such a fashion is preferably from 5 μm to 200 μm.

A method of manufacturing the connector 11 will next be described.

First, a molding die for the base portion 12 is prepared. The molding die is formed of a non-magnetic substance, and, in the molding die, an orientation pin of a ferromagnetic substance is buried for forming the conductive portion 13. One end of the orientation pin is exposed at a cavity surface at a position where the conductive portion 13 is formed. Next, a large rolled metal plate is stamped, so that the metal plate 14 is formed. Primer is applied to the metal plate 14 in order to enhance the adhesion force with the base portion 12 made of a rubber elastic body. At this point, primer is not applied to a portion to be brought into contact with the conductive portion 13. Then, the metal plate 14 is inserted into the above-described molding die, and liquid rubber with the magnetic conductors 1 dispersed therein is injected into a cavity of the molding die. After magnetic fields are applied to the molding die to orient the magnetic conductors 1, and, as a result, the conductive portion 13 is formed, the liquid rubber is heat cured to form the base portion 12, and, at the same time to be integrated with the metal plate 14. Thus, the connector 11 is obtained.

Note that while one end of the orientation pin is exposed at the cavity surface in the molding die of the base portion 12 of the present embodiment, the conductive portion 13 can be formed with a die in which one end of an orientation pin is not exposed at a cavity surface.

A method of mounting the connector 11 will be described.

A printed circuit board 2 is made of glass epoxy, and a circuit pattern 3 of copper foil is formed thereon. An insulating layer 4 made of resist ink is formed on the circuit pattern 3 except for an area where electronic components and the like are fixed. As illustrated in FIG. 4, a solder paste 5 is applied to the circuit pattern 3, and the connector 11 is placed on the solder 5. Upon insertion into a reflow oven, as illustrated in FIG. 5, the connector 11 is mounted onto the printed circuit board 2. In the present embodiment, the conductive portion 13 is electrically connected to the circuit pattern 3 through the metal plate 14 fixed in place with the solder 5.

The connector 11 includes the metal plate 14 on the bottom surface 12c of the base portion 12, and therefore can be fixed, with the solder 5, to the circuit pattern 3 of the printed circuit board 2 facing the metal plate 14. Further, the metal plate 14 is provided so as to cover the whole bottom surface 12c having a rectangular shape and extends across opposite sides of the bottom surface 12c, and therefore, as the "shape-retaining sheet", enables the base portion 12 to be less likely to be deformed, making it possible to facilitate handling of the base portion 12. Thus, the connector 11 for which bending during hand working, dropping-out from an automatic transport machine, and the like are less likely to occur can be implemented.

The conductive portion 13 projects from the surface of the metal plate 14, and therefore connection between a member to be connected and the connector 11 can be secured even if the member to be connected is separate from the surface of metal of the connector 11 by a thickness of solder.

The metal plate 14 is included as the "shape-retaining sheet", and therefore another "shape-retaining sheet" need not be included. This can decrease the number of members included in the connector 11.

The base portion 12 is made of the "elastic sheet", and therefore the base portion 12 can be elastically deformed, so that the connector 11 can be mounted in a pressure contact state.

Figure 6:
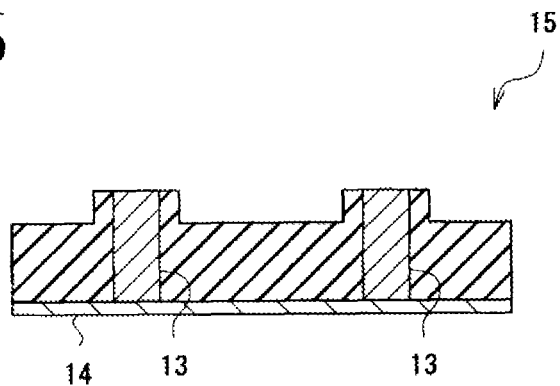
FIG. 6 is a cross-sectional view corresponding to FIG. 2, illustrating a first modification of the connector in the first embodiment.

First Modification of First Embodiment [FIG. 6]

Regarding the connector 11 of the first embodiment, an example having one conductive portion 13 has been demonstrated. However, as illustrated in FIG. 6, a plurality of (two in the figure) conductive portions 13 can be included in parallel in the connector 15 of a first modification.

Even in this way, the connector 15 can be fixed to the circuit pattern 3 with the solder 5, and the metal plate 14, as the "shape-retaining sheet", enables bending during hand working, dropping-out from an automatic transport machine, and the like of the connector 15 to be less likely to occur. Connection using a plurality of conductive portions 13 allows the connection area to be larger than connection using one conductive portion 13, so that the connection resistance can be decreased. If the plurality of conductive portions 13 are included, at least one conductive portion 13 only needs to be connected between members to be connected, and therefore electrical connection can be ensured.

Note that the connector 15 in which the two conductive portions 13 are arranged has been described as an example in the present modification; however, multiple conductive portions 13 can be arranged in a matrix.

Figure 7:
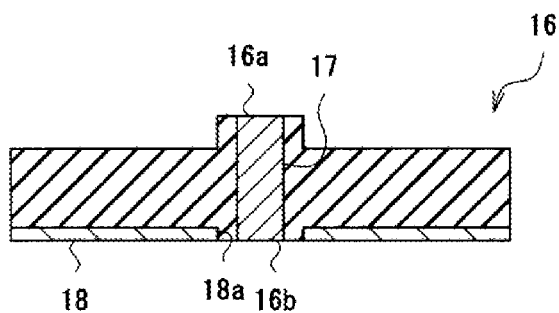
FIG. 7 is a cross-sectional view corresponding to FIG. 2, illustrating a second modification of the connector in the first embodiment.
Figure 8:
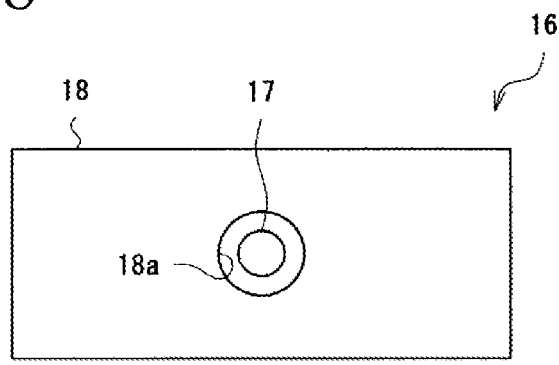
FIG. 8 is a bottom view illustrating the second modification of the connector in the first embodiment.

Second Modification of First Embodiment [FIG. 7, FIG. 8]

Regarding the connector 11 of the first embodiment, an example in which the other end of the conductive portion 13 is in contact with the metal plate 14, and the metal plate 14 forms the lower electrode surface 11b of the connector 11 has been demonstrated. However, in the connector 16 of the second modification, the other end of the conductive portion 17 penetrates a through hole 18a of a metal plate 18 to be exposed on a lower surface side of the connector 16, so that a surface flush with the metal plate 18 can be formed. That is, one end of the conductive portion 17 forms an upper electrode surface 16a of the connector 16, and the other end forms a lower electrode surface 16b of the connector 16.

Even in this way, the connector 16 can be fixed to the circuit pattern 3 with the solder 5, and the metal plate 14, as the "shape-retaining sheet", enables bending during hand working, dropping-out from an automatic transport machine, and the like of the connector 15 to be less likely to occur.

A bonding region with solder and the conductive portion 13 can be isolated, and can each be applied to a case where conduction is not desired.

Figure 9:
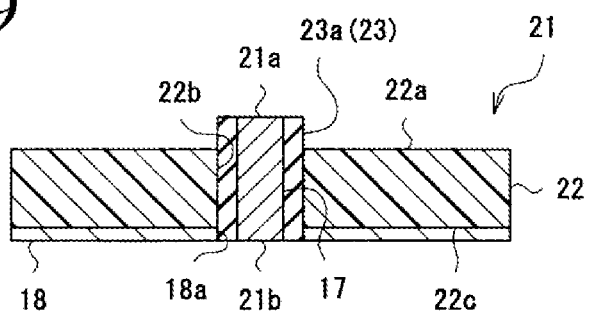
FIG. 9 is a cross-sectional view corresponding to FIG. 2, illustrating a connector of a second embodiment.

Second Embodiment [FIG. 9]

A connector 21 of a second embodiment is illustrated in FIG. 9. FIG. 9 is a cross-sectional view of the connector 21. The connector 21 of the second embodiment differs from the connector 11 of the first embodiment in the configuration of a base portion 22 and inclusion of the conductive portion 17 and the metal plate 18 in place of the conductive portion 13 and the metal plate 14, respectively.

The base portion 22 is made of a resin molded body and is formed so as to be rectangular in plan view. In the base portion 22, one through hole 22b passing through the base portion 22 is provided in a thickness direction of the base portion 22. A rubber elastic body 23 having the conductive portion 17 penetrates inside of the through hole 22b. One end of the rubber elastic body 23 projects from a top surface 22a of the base portion 22 such that a cylinder-shaped connection projection 23a is provided, and one end of the conductive portion 17 is exposed to an end surface of the connection projection 23a. The other end of the rubber elastic body 23 projects from a bottom surface 22c of the base portion 22 and penetrates the through hole 18a of the metal plate 18, and, at the end surface thereof, the other end of the conductive portion 17 is exposed. That is, one end of the conductive portion 17 forms an upper electrode surface 21a of the connector 21, and the other end forms a lower electrode surface 21b of the connector 21.

As materials for the resin molded body used for the base portion 22, heat-resistant thermoplastic resins and hardening resins that are less likely to be deformed by heat at the time when the connector 21 is fixed in place with the solder 5 can be used. For example, polyethylene terephthalate resin, polyethylene naphthalate resin, polyimide resin, polyacetal resin, polycarbonate resin, modified-polyphenylene ether, polybutylene terephthalate resin, liquid crystal polymer, epoxy resin, polyether ether ketone resin, polyamide resin, and the like are included. Further, these resins can be combined with glass fiber, carbon black, and the like so that the resins are strengthened. The thickness of the base portion 22 is preferably from 200 μm to 5000 μm.

A method of manufacturing the connector 21 will be described. First, a large rolled metal plate is stamped, so that the metal plate 18 having the through hole 18a is formed. Primer is applied to the metal plate 18 in order to enhance the adhesion force with the base portion 22 made of a resin molded body. The metal plate 18 is next inserted into a molding die of the base portion 22, and the base portion 22 and the metal plate 18 are integrally formed. The base portion 22 integral with the metal plate 18 is inserted to the molding die of the rubber elastic body 23, and liquid rubber with the magnetic conductors 1 dispersed therein is injected. After magnetic fields are applied to the molding die of the rubber elastic body 23 to orient the magnetic conductors 1, and, as a result, the conductive portion 17 is formed, the liquid rubber is heat cured to form the base portion 12 and, at the same time, to be integrated with the base portion 22. Thus, the connector 21 is obtained.

A method of mounting the connector 21 will be described. As with the connector 11, the printed circuit board 2 is prepared, and the connector 21 is placed on the solder paste 5 of the circuit pattern 3. Upon insertion into a reflow oven, the connector 21 is mounted onto the printed circuit board 2. The conductive portion 17 of the present embodiment is in contact with the circuit pattern 3 to be electrically connected.

The connector 21 includes the metal plate 13 on the bottom surface 22c of the base portion 22, and therefore can be fixed, with the solder 5, to the circuit pattern 3 of the printed circuit board 2 facing the metal plate 18. Further, since the base portion 22 is made of a resin molded body, the base portion 22 can be less likely to be deformed than the base portion 12 made of an elastic sheet, making it possible to facilitate handling of the base portion 22. Thus, the connector 21 for which bending during hand working, dropping-out from an automatic transport machine, and the like are less likely to occur can be implemented.

Figure 10:
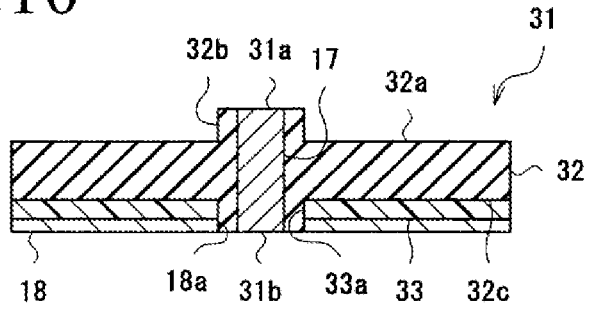
FIG. 10 is a cross-sectional view corresponding to FIG. 2, illustrating a connector of a third embodiment.

Third Embodiment [FIG. 10]

A connector 31 of a third embodiment is illustrated in FIG. 10. FIG. 10 is a cross-sectional view of the connector 31. The connector 31 of the third embodiment differs from the connector 11 of the first embodiment in the configuration of a base portion 32, inclusion of the conductive portion 17 and the metal plate 18 in place of the conductive portion 13 and the metal plate 14, respectively, and further inclusion of a resin film 33.

The base portion 32, like the base portion 12, is an "elastic sheet" made of an insulating rubber elastic body and is formed so as to be rectangular in plan view. On a top surface 32a of the base portion 32, a cylinder-shaped connection projection 32b projecting in the thickness direction of the base portion 32 is provided, and one end of the conductive portion 17 is exposed at an end surface of the connection projection 32b. Differences from the base portion 12 are that the other end of the conductive portion 17 projects from a bottom surface 32c of the base portion 32 and penetrates the through hole 18a of the metal plate 18, and that the other end is exposed to form a surface that is flush with the metal plate 18. That is, one end of the conductive portion 17 forms a top-surface electrode surface 31a of the connector 31, and the other end forms a lower electrode surface 31b of the connector 31.

The resin film 33 is formed into a rectangular shape, which is approximately the same as the base portion 32 in plan view, and adheres, as a "shape-retaining sheet" for the base portion 32, between the whole bottom surface 32c of the base portion 32 and the metal plate 18. In the resin film 33, a through hole 33a that matches to the through hole 18a of the metal plate 18 is formed, and the conductive portion 17 penetrates the inside of the through hole 33a, like the through hole 18a.

As a material for resin used for the film 33, resin having good heat-resistance whose size is less likely to change during insert molding is used. For example, polyethylene terephthalate resin, polyethylene naphthalate resin, kapton resin, polyimide resin, and the like are included. The thickness of the resin film 33 is preferably from 10 μm to 200 μm.

A method of manufacturing the connector 31 will be described. First, after a resin film is laminated to a large rolled metal plate, and the metal plate is stamped, so that a layered sheet made up of the metal plate 18 having the through holes 18a and 33a and the resin film 33 is formed. Primer is applied to the layered sheet in order to enhance the adhesion force with the base portion 32 made of a rubber elastic body. The layered sheet is next inserted into a molding die of the base portion 32, and liquid rubber with the magnetic conductors 1 dispersed therein is injected into a cavity of the molding die. After magnetic fields are applied to the molding die to orient the magnetic conductors 1, and, as a result, the conductive portion 17 is formed, the liquid rubber is heat cured to form the base portion 32, and, at the same time, to integrate the layered sheet. Thus, the connector 31 is obtained.

A method of mounting the connector 31 will be described. As with the connector 11, the printed circuit board 2 is prepared, and the connector 31 is placed on the solder paste 5 of the circuit pattern 3. Upon insertion into a reflow oven, the connector 31 is mounted onto the printed circuit board 2. The conductive portion 17 of the present embodiment is in contact with the circuit pattern 3 to be electrically connected.

The connector 31 includes the metal plate 18 on a side of the bottom surface 32c of the base portion 32, and therefore can be fixed, with the solder 5, to the circuit pattern 3 of the printed circuit board 2 facing the metal plate 18. Further, since the resin film can function as the "shape-retaining sheet", the stiffness of the resin film 33 in addition to the stiffness of the metal plate 18 or as a complement to the stiffness of the metal plate 18 enables the base portion 32 made of an elastic sheet to be less likely to be deformed. This can facilitate handling of the base portion 32. Thus, the connector 31 for which bending during hand working, dropping-out from an automatic transport machine, and the like are less likely to occur can be implemented.

Figure 11:
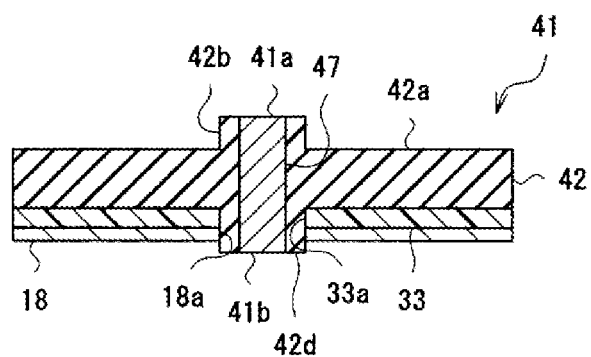
FIG. 11 is a cross-sectional view corresponding to FIG. 2, illustrating a connector of a fourth embodiment.

Fourth Embodiment [FIG. 11]

A connector 41 of a fourth embodiment is illustrated in FIG. 11. FIG. 11 is a cross-sectional view of the connector 41. The connector 41 of the fourth embodiment differs from the connector 31 of the third embodiment in the configuration of a conductive portion 47 that a base portion 42 has. Other configurations, operations, and effects are the same as those of the connector 31.

Regarding the conductive portion 47, like the conductive portion 17 of the connector 31, one end of the conductive portion 47 is exposed at an end surface of a connection projection 42b of the base portion 42 to form an upper electrode surface 41a of the connector 41. A difference from the conductive portion 17 is that the other end of the conductive portion 47 is exposed at an end surface of a cylinder-shaped connection projection 42d projecting in the thickness direction from the metal plate 18 to form a lower electrode surface 41a of the connector 41.

A method of manufacturing the connector 41 will be described. First, as with the connector 31, after a resin film is laminated to a large rolled metal plate, and the metal plate is stamped, so that a layered sheet made up of the metal plate 18 having the through holes 18a and 33a and the resin film 33 is formed. Primer is applied to the layered sheet in order to enhance the adhesion force with the base portion 32 made of a rubber elastic body. The layered sheet is next inserted into a molding die of the base portion 42, and liquid rubber with the magnetic conductors 1 dispersed therein is injected into a cavity of the molding die. After magnetic fields are applied to the molding die to orient the magnetic conductors 1, and, as a result, the conductive portion 47 is formed, the liquid rubber is heat cured to form the base portion 42, and, at the same time, to integrate the resin film 33 of the layered sheet and the metal plate 18. Thus, the connector 41 is obtained.

A method of mounting the connector 41 will be described. As with the connector 31, the printed circuit board 2 is prepared, and the connector 41 is placed on the solder paste 5 of the circuit pattern 3. Upon insertion into a reflow oven, the connector 41 is mounted onto the printed circuit board 2. The conductive portion 47 of the present embodiment is in contact with the circuit pattern 3 to be electrically connected.

Regarding the connector 41, the lower electrode surface 41b of the connector 41, which is the other end of the conductive portion 47, projects from the metal plate 18 toward the printed circuit board 2, and therefore it is possible to cause a clearance between the circuit pattern 3 and the lower electrode surface 41b to be less likely to be formed during mounting in a reflow oven. When the connector 41 is brought into pressure contact with the printed circuit board 2, the connection projection 42d is easily deformed, and therefore a load for pressing can be decreased. Note that the height of projection of the lower electrode surface 41b is preferably from 0.05 mm to 0.2 mm that is equal to the thickness of the solder.

Figure 12:
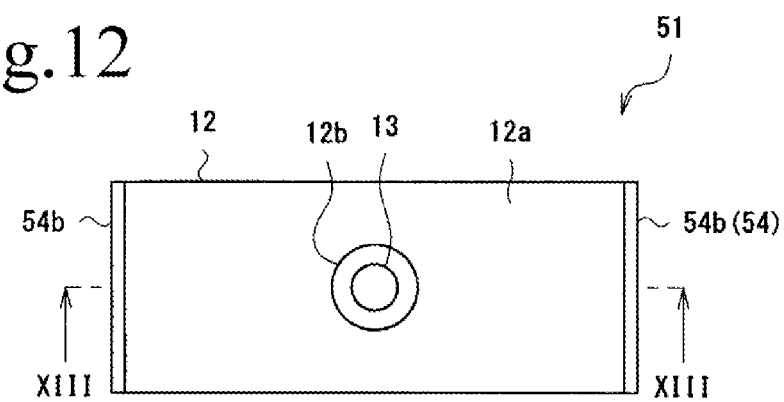
FIG. 12 is a plan view illustrating a connector of a fifth embodiment.
Figure 13:
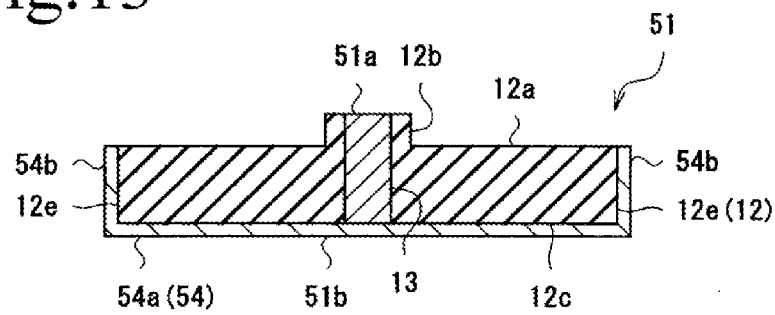
FIG. 13 is a cross-sectional view taken along the line XIII-XIII of FIG. 12.
Figure 14:
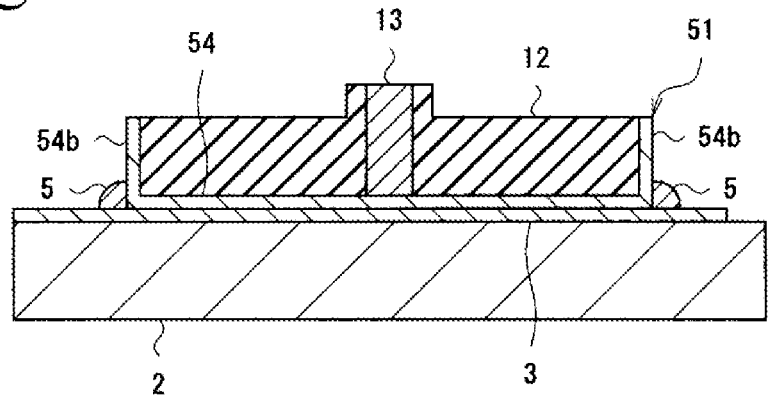
FIG. 14 is an explanatory view illustrating a state in which the connector is mounted in the fifth embodiment.

Fifth Embodiment [FIG. 12 to FIG. 14]

A connector 51 of a fifth embodiment is illustrated in FIG. 12 to FIG. 14. FIG. 12 is a plan view of the connector 51, FIG. 13 is a cross-sectional view taken along the line XIII-XIII of the connector 51, and FIG. 14 is an explanatory view illustrating a state in which the connector 51 is mounted. The connector 51 of the fifth embodiment differs from the connector 11 of the first embodiment in the configuration of a metal plate 54. Other configurations, operations, and effects are the same as those of the connector 11.

The metal plate 54, like the metal plate 14, adheres, as a "shape-retaining sheet" for the base portion 12, in such a manner as to cover the whole bottom surface 12c of the base portion 12. The metal plate 54 is in contact with the other end of the conductive portion 13 and forms a lower electrode surface 51b of the connector 51. That is, one end of the conductive portion 13 forms an upper electrode surface 51a of the connector 51, and the metal plate 54 forms the lower electrode surface 51b of the connector 51. Differences from the metal plate 14 are that the metal plate 54 is made up of a bottom surface support portion 54a covering the bottom surface 12c of the base portion 12 rectangular in plan view and side surface support portions 54b extending along side surfaces 12e on the shorter sides of the bottom surface 12c, and that the side surface support portions 54b cover the whole side surfaces 12e on the shorter sides.

A method of manufacturing the connector 51 will be described. First, after a large rolled metal plate is stamped, the metal plate is bent along the bottom surface 12c of the base portion 12 and the side surfaces 12e on the shorter sides, so that the metal plate 54 made up of the bottom surface support portion 54a and the side surface support portions 54b is formed. Primer is applied to the metal plate 54 in order to enhance the adhesion force with the base portion 12 made of a rubber elastic body. However, primer is not applied to a portion to be brought into contact with the conductive portion 13. The metal plate 54 is inserted into a molding die of the base portion 12, and liquid rubber with the magnetic conductors 1 dispersed therein is injected into a cavity of the molding die. After magnetic fields are applied to the molding die to orient the magnetic conductors 1, and, as a result, the conductive portion 13 is formed, the liquid rubber is heat cured to form the base portion 12, and, at the same time, to integrate the base portion 12 with the metal plate 54. Thus, the connector 51 is obtained.

A method of mounting the connector 51 will be described. The printed circuit board 2 is prepared, and the connector 51 is placed on the circuit pattern 3. By means of hand working, the connector 51 is fixed to the side surface support portion 54b of the metal plate 54 with the solder 5, so that the connector 51 can be mounted. The conductive portion 13 of the present embodiment is electrically connected through the metal plate 54 fixed to the circuit pattern 3 with the solder 5. As another mounting method, as with the connector 11, the printed circuit board 2 is prepared, and the connector 51 is placed on the solder paste 5 of the circuit pattern 3. Upon insertion into a reflow oven, the connector 51 can be mounted onto the printed circuit board 2.

Regarding the connector 51, the metal plate 54 has the side surface support portion 54b, and therefore, through the use of this side surface support portion 54b, the connector 51 can be fixed in place with the solder 5, which enables the fixing in place with the solder 5 to be made easy.

The adhesion with the solder 5 can be made through side surfaces of the connector 51, which allows solder to be not attached onto a contact surface for securing connection between the conductive portion 13 and a member to be connected. Therefore, the connector 51 and the member to be connected can adhere to each other while being in contact with each other in a large area. Poor conduction can thus be reduced. After the connector 51 and a member to be connected are brought into compressive contact, solder is attached to them to enable them to adhere to each other. The freedom for soldering expands.

Further, the metal plate 54 is the "shape-retaining sheet", and therefore a corner portion made up of the bottom surface support portion 54a and the side surface support portion 54b can enhance the stiffness of the metal plate 54. This enables the base portion 12 to be less likely to be deformed. It is possible to facilitate handing of the base portion 12.

Figure 15:
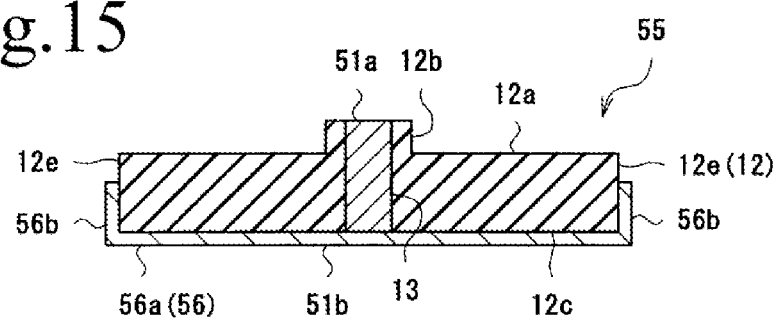
FIG. 15 is a cross-sectional view corresponding to FIG. 12, illustrating a modification of the connector in the fifth embodiment.

Modification of Fifth Embodiment [FIG. 15]

Regarding the connector 51 of the fifth embodiment, an example in which the side surface support portion 54b covers the whole side surface 12e on the shorter side of the base portion 12 has been demonstrated. However, as illustrated in FIG. 15, in a connector 55 of a modification, a metal plate 56 can include side surface support portions 56b partially covering side surfaces 12e on the shorter sides.

Even in this way, through the use of the side surface support portion 56b, the connector 55 can easily be fixed in place with the solder 5 by means of hand working, and the shape retaining property of the base portion 12 owing to the metal plate 56 is high.

Also, regarding the connectors 51 and 55, examples in which the metal plates 54 and 56 are used as "shape-retaining sheets" of the base portions 12 have been demonstrated. However, as with the connector 31, a resin film is sandwiched between the metal plate 54 or 56 and the base portion 12, and a layered sheet made up of the resin film and the metal plate 54 or 56 can be a "shape-retaining sheet".

Figure 16:
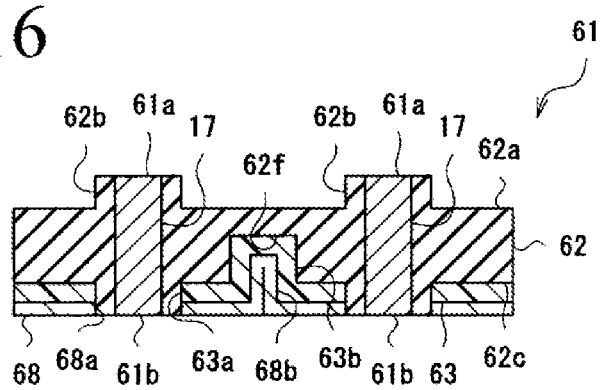
FIG. 16 is a cross-sectional view corresponding to FIG. 2, illustrating a connector of a sixth embodiment.
Figure 17:
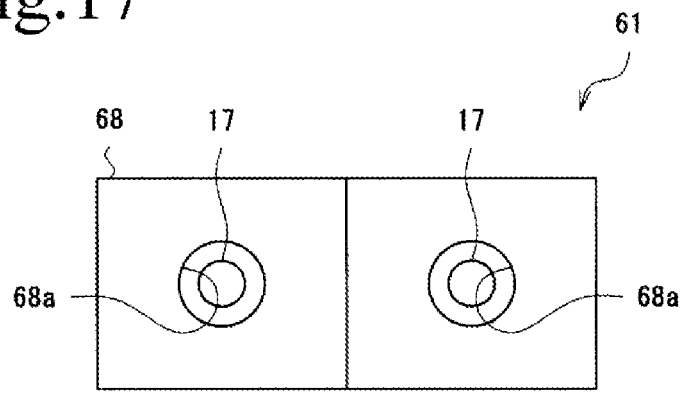
FIG. 17 is a bottom view illustrating the connector of the sixth embodiment.

Sixth Embodiment [FIG. 16, FIG. 17]

A connector 61 of a sixth embodiment is illustrated in FIG. 16. FIG. 16 is a cross-sectional view of the connector 61, and FIG. 17 is a bottom view of the connector 61. The connector 61 of the sixth embodiment differs from the connector 31 of the third embodiment in the configurations of a base portion 62, a resin film 63, and a metal plate 68, and inclusion of two conductive portions 17.

The base portion 62, like the base portion 32, is an "elastic sheet" made of an insulating rubber elastic body and is formed so as to be rectangular in plan view. A difference from the base portion 32 is that the base portion 62 has in the inside thereof two conductive portions 17 whose thickness directions are conductive directions such that the conductive portions 17 are approximately in parallel. On a top surface 62a of the base portion 62, two cylinder-shaped connection projections 62b projecting in the thickness direction of the base portion 62 are provided, and one ends of the conductive portions 17 are exposed at the respective end surfaces of the connection projections 62b. The other ends of the conductive portions 17 project from a bottom surface 62c of the base portion 62 and penetrate through holes 63a and 68a of resin film 63 and the metal plate 68, respectively, and the other ends are exposed to form surfaces that are flush with the metal plate 68. That is, one ends of the two conductive portions 17 form the upper electrode surface 61a of the connector 61, and the other ends form a lower electrode surface 61b of the connector 61. Further, a receiving groove 62f across longer sides of the rectangular-shaped bottom surface 62c is provided between the conductive portions 17 on the bottom surface 62c.

The resin film 63 and the metal plate 68 are layered and have the two through holes 63a and 68a as described above, and, as a "shape-retaining sheet" for the base portion 62, in order to cover the whole bottom surface 62c of the base portion 62, the side of the resin film 63 adheres to the bottom surface 62c. Foldout projections 63b and 68b as "projecting portions" projecting into the receiving groove 62f of the base portion 62 are formed.

A method of manufacturing the connector 61 will be described. First, after a resin film is laminated to a large rolled metal plate. After the metal plate is stamped, the foldout projection 63b and 68b are formed, and the metal plate is further stamped, so that a layered sheet made up of the resin film 63 having the through holes 63a and 68a and the metal plate 68 is formed. Primer is applied to the layered sheet in order to enhance the adhesion force with the base portion 62 made of a rubber elastic body. The layered sheet is next inserted into a molding die of the base portion 62, and liquid rubber with the magnetic conductors 1 dispersed therein is injected into a cavity of the molding die. After magnetic fields are applied to the molding die to orient the magnetic conductors 1, and, as a result, the conductive portions 17 are formed, the liquid rubber is heat cured to form the base portion 62, and, at the same time, to integrate the layered sheet. Thus, the connector 61 is obtained.

A method of mounting the connector 61 will be described. As with the connector 31, the printed circuit board 2 is prepared, and the connector 61 is placed on the solder paste 5 of the circuit pattern 3. Upon insertion into a reflow oven, the connector 61 is mounted onto the printed circuit board 2. The conductive portion 17 of the present embodiment is in contact with the circuit pattern 3 to be electrically connected.

Regarding the connector 61, when the metal plate 68 is fixed in place with the solder 5 so as to be connected to the ground provided on the printed circuit board 2, the conductive portions 17 separated by the foldout projection 68b of the metal plate 68 are also electromagnetically separated. This enables signals separately flowing through the conductive portions 17 to be less likely to be mutually affected. Conductive connections for high-frequency applications can be realized with the connector 61.

Further, regarding the resin film 63 and the metal plate 68 serving as a shape-retaining sheet, the stiffness of the resin film 63 and the stiffness of the metal plate 68 can be enhanced by the foldout projection 63b and 68b. This enables the base portion 62 to be less likely to be deformed. This can facilitate handling of the base portion 62.

Seventh Embodiment [FIG. 18 to FIG. 21]

Figure 18:
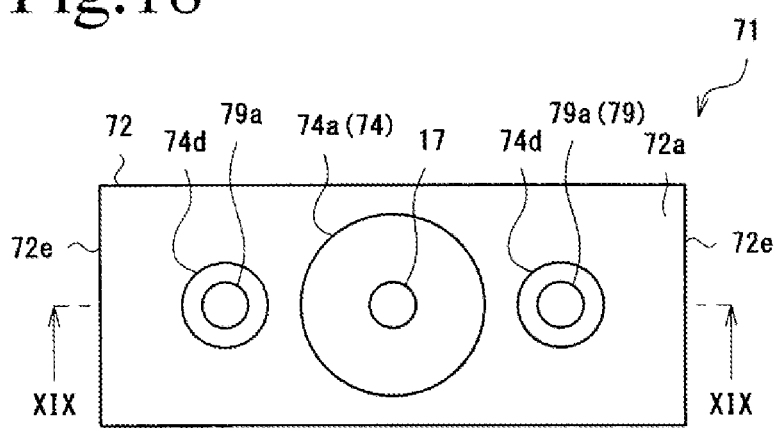
FIG. 18 is a plan view illustrating a connector of a seventh embodiment.
Figure 19:
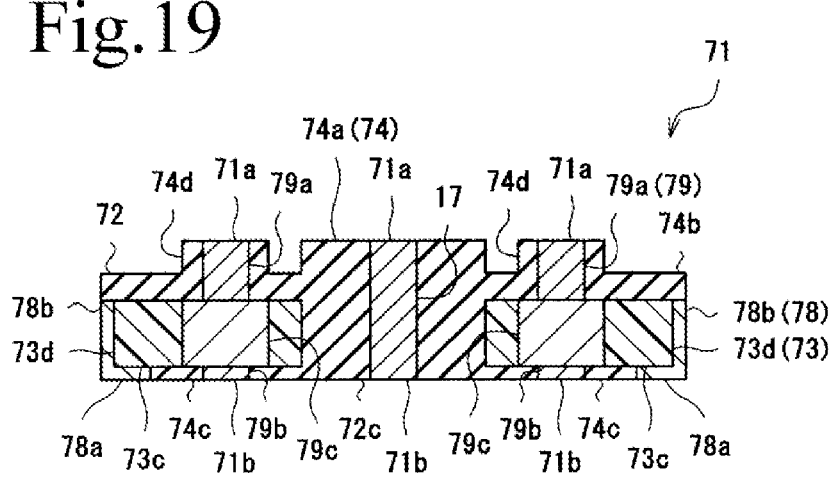
FIG. 19 is a cross-sectional view taken along the line XIX-XIX of FIG. 18.
Figure 20:
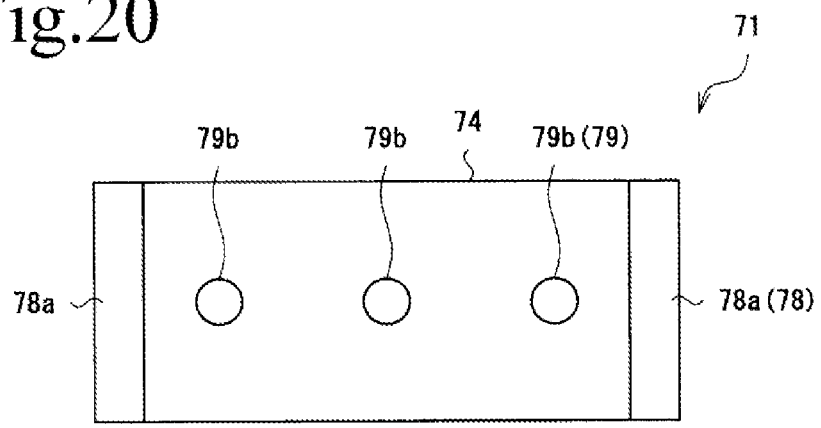
FIG. 20 is a bottom view illustrating the connector of the seventh embodiment.
Figure 21:
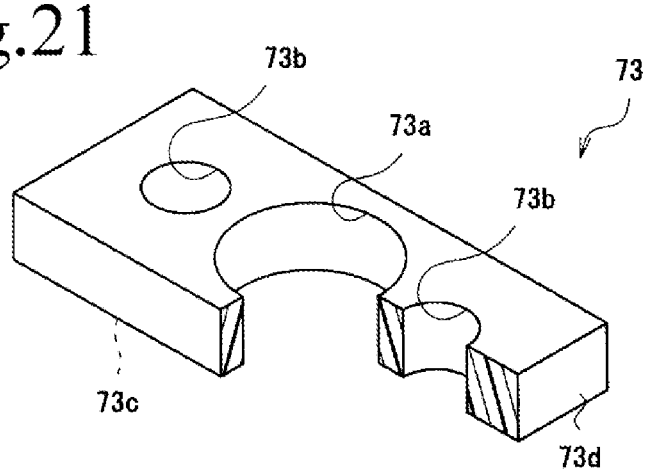
FIG. 21 is an explanatory view of a resin molded body used for the connector of the seventh embodiment.

A connector 71 of a seventh embodiment is illustrated in FIG. 18 to FIG. 21. FIG. 18 is a plan view of the connector 71, FIG. 19 is a cross-sectional view taken along the line XIX-XIX of the connector 71, FIG. 20 is a bottom view of the connector 71, and FIG. 21 is a perspective view of a resin molded body 73 for use in the connector 71. The connector 71 of the seventh embodiment differs from the connector 21 of the second embodiment in the configurations of a base portion 72 and a metal plate 78, and inclusion of two conductive portions 79 in addition to the conductive portion 17.

The base portion 72 is made up of the resin molded body 73 and a rubber elastic body 74.

The resin molded body 73 is a "shape-retaining sheet" for the base portion 72, and, as illustrated in FIG. 21, is formed in a rectangular plane in plan view. Approximately at the center of the resin molded body 73, a through hole 73a passing through the thickness is provided, and two small through holes 73b having a diameter slightly smaller than the through hole 73a are provided in such a manner that the through hole 73a is sandwiched therebetween. In the inside of these small through holes 73b, "metal poles" to be described later are buried.

The rubber elastic body 74 includes a main body portion 74a that penetrates the through hole 73a of the resin molded body 73, and an upper covering portion 74b covering the top surface of the resin molded body 73 and a lower covering portion 74c covering the bottom surface of the resin molded body 73. Among these, the main body portion 74a has one conductive portion 17 passing through the inside of the through hole 73a of the resin molded body 73. One end of the main body portion 74a projects from a top surface 72a of the base portion 72, and, at the end surface thereof, one end of the conductive portion 17 is exposed. The other end of the main body portion 74a forms the bottom surface 72c of the base portion 72 that is flush with the lower covering portion 74c and is flat, and the other end of the conductive portion 17 is exposed. The upper covering portion 74b has an upper orientation conductive portion 79a constituting the conductive portion 79. One end of the upper orientation conductive portion 79a is exposed at an end surface of a cylinder-shaped connection projection 74a projecting from the top surface 72a of the base portion 72, and the other end is in contact with the top surface of the "metal pole". The lower covering portion 74c has a lower orientation conductive portion 79b included in the conductive portion 79. One end of the lower orientation conductive portion 79b is in contact with the bottom surface of the "metal pole", and the other end is exposed to the bottom surface 72c of the base portion 72.

Two metal plates 78 are provided. Each metal plate 78 is made up of a bottom surface support portion 78a covering an edge portion on the shorter side on the bottom surface 72c of the base portion 72, and a side surface support portion 78b extending on the side surface 72a on the shorter side of the bottom surface 72c, and the side surface support portion 78b adheres so as to cover part of the side surface 72a of the base portion 72. In other words, the bottom surface support portion 78a of the metal plate 78 covers an edge portion on the shorter side on a bottom surface 73c of the resin molded body 73, and the side surface support portion 78b covers the entirety of a side surface 73d on the shorter side of the resin molded body 73.

Two conductive portions 79 are provided such that the conductive portion 17 is sandwiched therebetween. The conductive portion 79 is made up of the upper orientation conductive portion 79a in which the magnetic conductors 1 linked are oriented together inside of the upper covering portion 74b, a metal conductive portion 79c made of a "metal pole", and the lower orientation conductive portion 79b in which the magnetic conductors 1 linked are oriented together inside of the lower covering portion 74c.

As seen from the foregoing, top-surface electrode surfaces 71a of the connector 71 include one made of an exposed surface on the side of one end of the conductive portion 17 and two made up of exposed surfaces on the sides of one ends of the upper orientation conductive portions 79a in the conductive portion 79. Bottom-surface electrode surfaces 71b of the connector 71 include one surface made of an exposed surface on the side of the other end of the conductive portion 17 and two surfaces made of exposed surfaces on the sides of the other ends of the lower orientation conductive portions 79b in the conductive portion 79.

As the material for the "metal pole", magnetic conductors are used, and examples thereof include nickel, cobalt, iron, ferrite, and alloys of these. This "metal pole" is formed by cutting, stamping or molding using a die.

A method of manufacturing the connector 71 will be described. First, the metal plates 78 and the "metal pole" are formed. After primer is applied to surfaces of the metal plates 78 and the "metal pole" where they are to adhere to the resin molded body 73, these are inserted into a molding die of the resin molded body 73, so that the metal plates 78 and the "metal pole" are formed integrally with the resin molded body 73. Next, the integrally formed resin molded body 73 is inserted into a molding die of the rubber elastic body 74, and liquid rubber with the magnetic conductors 1 dispersed therein is injected into a cavity of the molding die. After magnetic fields are applied to the molding die to orient the magnetic conductors 1, and, as a result, the conductive portions 17, the upper orientation conductive portions 79a, and the lower orientation conductive portions 79b are formed, the liquid rubber is heat cured to form the rubber elastic body 74, and, at the same time, to integrate the integrally formed resin molded body 73. Thus, the connector 71 is obtained.

A method of mounting the connector 71 will be described. The printed circuit board 2 is prepared, and the connector 71 is placed on the circuit pattern 3. By means of hand working, the connector 71 is fixed to the side surface support portions 78b of the metal plate 78 with the solder 5, so that the connector 71 can be mounted. The conductive portions 17 and 79 of the present embodiment are in contact with the circuit pattern 3 to be electrically connected. As another mounting method, as with the connector 21, the printed circuit board 2 is prepared, and the connector 71 is placed on the solder paste 5 of the circuit pattern 3. Upon insertion into a reflow oven, the connector 71 can be mounted onto the printed circuit board 2.

Through the use of the metal plates 78, the connector 71 can be fixed to the circuit pattern 3 with the solder 5. Further, the stiffness of the resin molded body 73 enables the base portion 72 to be less likely to be deformed, making it possible to facilitate handling of the base portion 72. Thus, it is possible to cause the bending during handworking and dropping-out from an automatic transport machine to be less likely to occur.

Part of the conductive portion 79 is made of the "metal pole", and therefore the conductivity of the conductive portion 79 can be enhanced, so that a large current with driving control other than signals can pass through the conductive portion 79. This "metal pole" is covered with the resin molded body 73 and the rubber elastic body 74, and therefore the surface is resistant to oxidizing.

Figure 22:
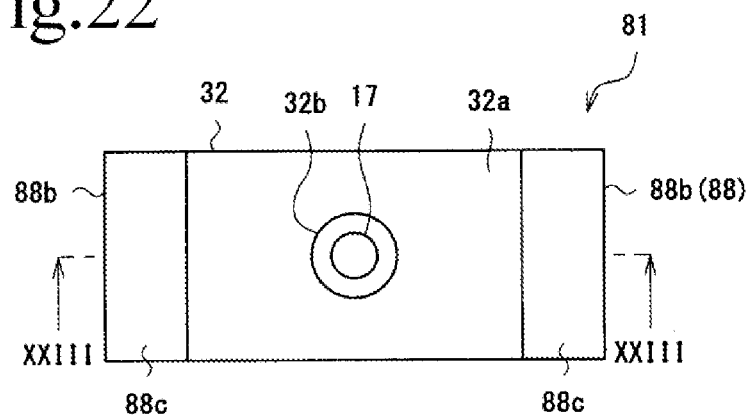
FIG. 22 is a plan view illustrating a connector of an eighth embodiment.
Figure 23:
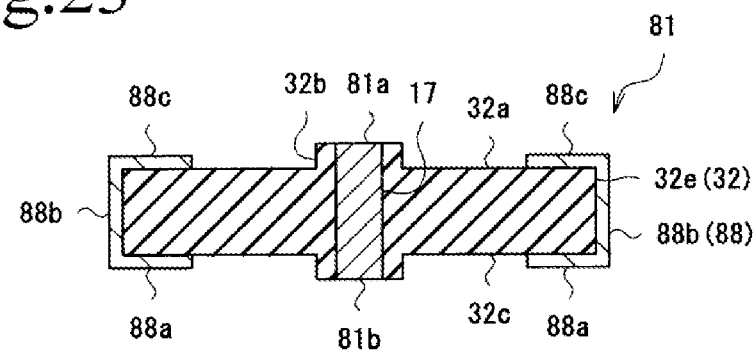
FIG. 23 is a cross-sectional view taken along the line XXIII-XXIII of FIG. 22.

Eighth Embodiment [FIG. 22, FIG. 23]

A connector 81 of an eighth embodiment is illustrated in FIG. 22 and FIG. 23. FIG. 22 is a plan view of the connector 81, and FIG. 23 is a cross-sectional view taken along the line XXIII-XXIII of the connector 81. The connector 81 of the eighth embodiment differs from the connector 31 of the third embodiment in the configuration without the resin film 33 and inclusion of metal plates 88 in place of the metal plate 18. Other configurations, operations, and effects are the same as those of the connector 31. In the connector 81, one end of the conductive portion 17 forms an upper electrode surface 81a of the connector 81, and the other end forms a lower electrode surface 81b of the connector 81.

Two metal plates 88 are provided, and adhere, as "shape-retaining sheets" for the base portion 12, in such a manner as to cover corner portions on the shorter sides of the base portion 32 that is rectangular in plan view. That is, the metal plate 88 is square U-shaped in cross-section, and is made up of a bottom surface support portion 88a covering an edge portion on the shorter side on the bottom surface 32c of the base portion 32, and a side surface support portion 88b covering a side surface 32e on the shorter side on the bottom surface 32c, and a top surface support portion 88c covering an edge portion on the shorter side on the top surface 32a of the base portion 32.

A method of manufacturing the connector 81 will be described. First, the metal plates 88 having the bottom surface support portions 88a, the side surface support portions 88b, and the top surface support portions 88c are formed. After primer is applied to surfaces of the metal plates 88 where they are to adhere to the base portion 32, these are inserted into a molding die of the base portion 32, and liquid rubber with the magnetic conductors 1 dispersed therein is injected into a cavity of the molding die. After magnetic fields are applied to the molding die to orient the magnetic conductors 1, and, as a result, the conductive portion 17 is formed, the liquid rubber is heat cured to form the base portion 32, and, at the same time, to integrate the metal plates 88. Thus, the connector 81 is obtained.

A method of mounting the connector 81 will be described. The printed circuit board 2 is prepared, and the connector 81 is placed on the circuit pattern 3. By means of hand working, the connector 81 is fixed to the side surface support portions 88*b* of the metal plates 88 with the solder 5, so that the connector 81 can be mounted. The conductive portion 17 of the present embodiment is in contact with the circuit pattern 3 to be electrically connected. As another mounting method, as with the connector 31, the printed circuit board 2 is prepared, and the connector 81 is placed on the solder paste 5 of the circuit pattern 3. Upon insertion into a reflow oven, the connector 81 can be mounted onto the printed circuit board 2.

Regarding the connector 81, the metal plate 88 has the side surface support portion 88*b*, and therefore, through the use of this side surface support portion 88*b*, the connector 81 can be fixed in place with the solder 5. This can facilitate the fixing in place with the solder 5 by means of hand working.

Further, the metal plate 88 is the "shape-retaining sheet", and therefore a corner portion made up of the bottom surface support portion 88*a* and the side surface support portion 88*b* and a corner portion made up of the top surface support portion 88*c* and the side surface support portion 88*b* can enhance the stiffness of the metal plate 88. This enables the base portion 32 to be less likely to be deformed. It is possible to facilitate handling of the base portion 32.

Figure 24:
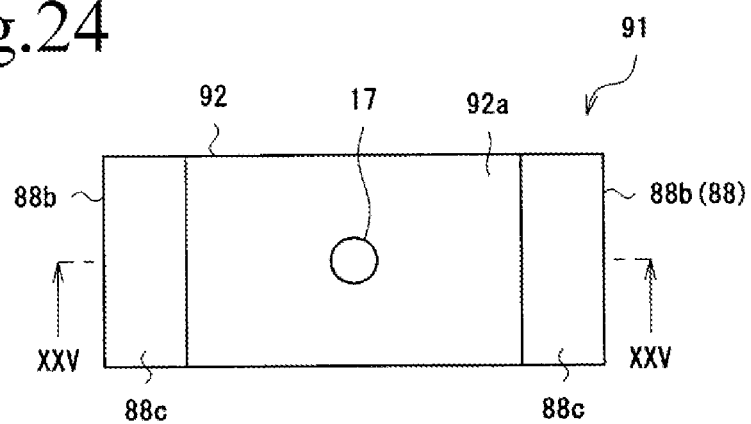
FIG. 24 is a plan view illustrating a connector of a ninth embodiment.
Figure 25:
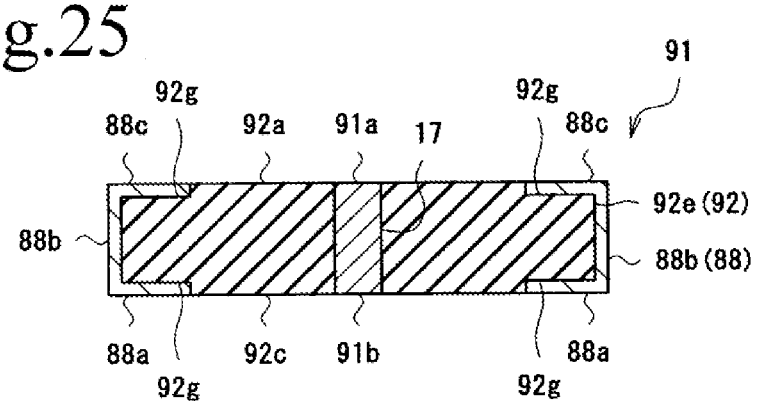
FIG. 25 is a cross-sectional view taken along the line XXV-XXV of FIG. 24.

Ninth Embodiment [FIG. 24, FIG. 25]

A connector 91 of a ninth embodiment is illustrated in FIG. 24 and FIG. 25. FIG. 24 is a plan view of the connector 91, and FIG. 25 is a cross-sectional view taken along the line XXV-XXV of the connector 91. The connector 91 of the ninth embodiment differs from the connector 81 of the eighth embodiment in the configuration of a base portion 92. Other configurations, operations, and effects are the same as those of the connector 81.

The base portion 92, like the base portion 32, is an "elastic sheet" made of an insulating rubber elastic body and is formed so as to be rectangular in plan view. A difference from the base portion 32 is that there is no connection projection, linear step surfaces 92*g* across the longer sides are formed around edges on the shorter sides of a top surface 92*a* and a bottom surface 92*c*, and the metal plates 88 covering side surfaces 92*e* of the base portion 92 adhere to the step surfaces 92*g*. One end of the conductive portion 17 is exposed to the top surface 92*a*, and the other end of the conductive portion 17 is exposed to the bottom surface 92*c*. That is, one end of the conductive portion 17 forms an upper electrode surface 91*a* of the connector 91, and the other end forms a lower electrode surface 91*b* of the connector 91.

A method of manufacturing the connector 91 will be described. First, the metal plates 88 are formed. After primer is applied to surfaces of the metal plates 88 where they are to adhere to the base portion 92, the two metal plates 88 are inserted into a molding die of the base portion 92, and liquid rubber with the magnetic conductors 1 dispersed therein is injected into a cavity of the molding die. After magnetic fields are applied to the molding die to orient the magnetic conductors 1, and, as a result, the conductive portion 17 is formed, the liquid rubber is heat cured to form the base portion 92, and, at the same time, to integrate the metal plates 88. Thus, the connector 91 is obtained.

A method of mounting the connector 91 will be described. The printed circuit board 2 is prepared, and the connector 91 is placed on the circuit pattern 3. By means of hand working, the connector 91 is fixed to the side surface support portions 88*b* of the metal plates 88 with the solder 5, so that the connector 91 can be mounted. The conductive portion 17 of the present embodiment is in contact with the circuit pattern 3 to be electrically connected. As another mounting method, as with the connector 31, the printed circuit board 2 is prepared, and the connector 91 is placed on the solder paste 5 of the circuit pattern 3. Upon insertion into a reflow oven, the connector 91 can be mounted onto the printed circuit board 2.

Regarding the connector 91, like the connector 81, through the use of the side surface support portion 88*b* of the metal plate 88, the connector 91 can be fixed in place with the solder 5. It is thus possible to facilitate the fixing in place with the solder 5 by means of hand working.

Further, the metal plate 88 is the "shape-retaining sheet", and therefore the base portion 32 can be made less likely to be deformed. It is possible to facilitate handling of the base portion 92.

Figure 26:
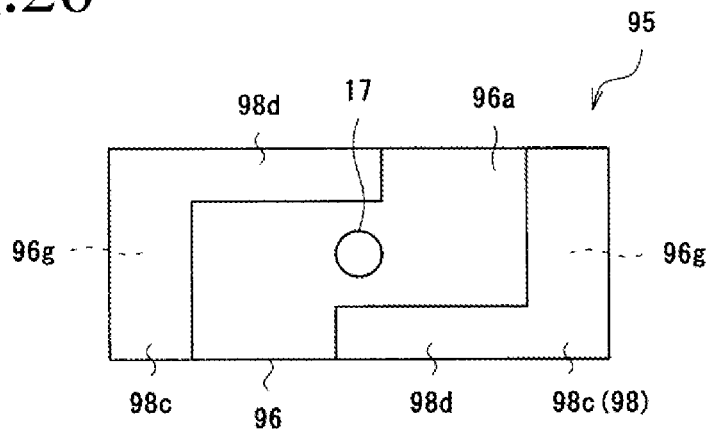
FIG. 26 is a plan view illustrating a modification of the connector of the ninth embodiment.

Modification of Ninth Embodiment [FIG. 26]

Regarding the connector 91 of the ninth embodiment, an example in which the step surfaces 92*g* formed on the top surface 92*a* and the bottom surface 92*c* of the base portion 92 are linear across the longer sides has been demonstrated. However, as illustrated in FIG. 26, in a connector 95 of a modification, step surfaces 96*g* formed on a top surface 96*a* of a base portion 96 are crank-shaped, which allows projection pieces 98*d* corresponding to the step surfaces 96*g* to be formed on top surface support portions 98*c* of metal plates 98. The projection pieces 98*d* of the two metal plates 98 each reach approximately the center of the top surface 96*a*, and extend such that they pass by each other with the conductive portion 17 sandwiched therebetween.

In this way, the stiffness of the projection piece 98*d* enables bending of the base portion 92 approximately parallel to the shorter sides of the base portion 92 that is rectangular in plan view to be less likely to occur.

Note that while the projection pieces 98*d* of the metal plates 98 are formed on the top surface 92*a* of the base portion 92 in the present modification, they can be formed on the bottom surface 92*c* or on the top surface 92*a* and the bottom surface 92*c*.

Figure 27:
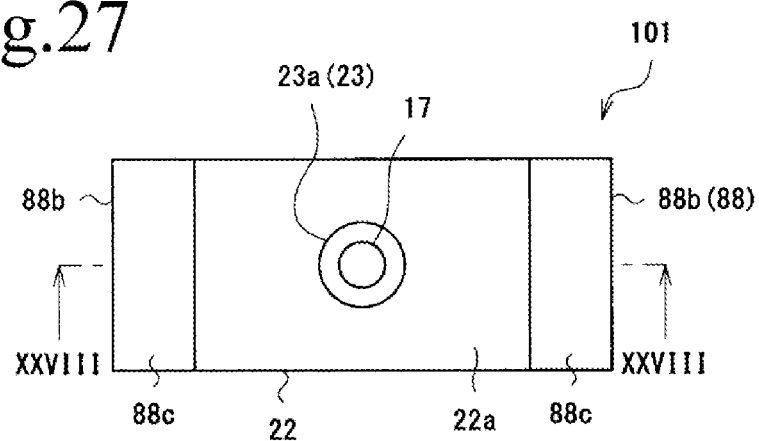
FIG. 27 is a plan view illustrating a connector of a tenth embodiment.
Figure 28:
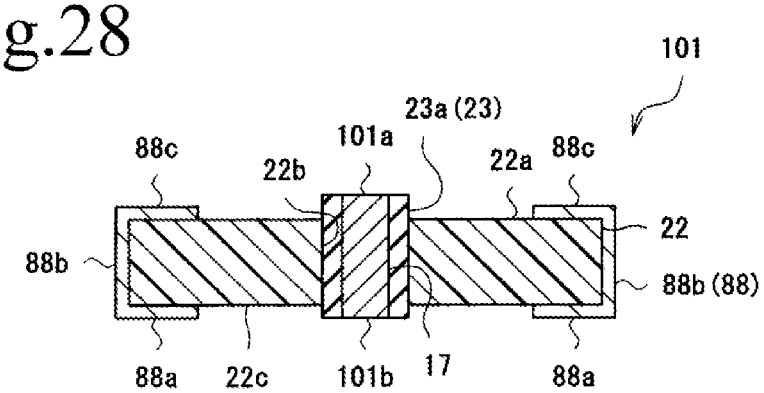
FIG. 28 is a cross-sectional view taken along the line XXVIII-XXVIII of FIG. 27.

Tenth Embodiment [FIG. 27, FIG. 28]

A connector 101 of a tenth embodiment is illustrated in FIG. 27 and FIG. 28. FIG. 27 is a plan view of the connector 101, and FIG. 28 is a cross-sectional view taken along the line XXVIII-XXVIII of the connector 101. The connector 101 of the tenth embodiment differs from the connector 21 of the second embodiment in the configuration of including the metal plate 88 in place of the metal plate 18. Other configurations, operations, and effects are the same as those of the connector 21. In the connector 101, one end of the conductive portion 17 forms an upper electrode surface 101*a* of the connector 101, and the other end forms a lower electrode surface 101*b* of the connector 101.

A method of manufacturing the connector 101 will be described. First, the metal plates 88 are formed. After primer is applied to surfaces of the metal plates 88 where they are to adhere to the base portion 22, the two metal plates 88 are inserted into a molding die of the base portion 22, and the base portion 22 and the metal plate 88 are integrally formed. Then, the base portion 22 integral with the metal plates 88 is inserted into a molding die of the rubber elastic body 23, and liquid rubber with the magnetic conductors 1 dispersed therein is injected. After magnetic fields are applied to the molding die to orient the magnetic conductors 1, and, as a result, the conductive portion 17 is formed, the liquid rubber is heat cured to form the rubber elastic body 23, and, at the same time, to integrate it with the metal plates 88. Thus, the connector 101 is obtained.

A method of mounting the connector 101 will be described. The printed circuit board 2 is prepared, and the connector 101 is placed on the circuit pattern 3. By means of hand working, the connector 101 is fixed to the side surface support portions 88*b* of the metal plates 88 with the solder 5, so that the connector 101 can be mounted. The conductive portion 17 of the present embodiment is in contact with the circuit pattern 3 to be electrically connected. As another mounting method, as with the connector 21, the printed circuit board 2 is prepared, and the connector 101 is placed on the solder paste 5 of the circuit pattern 3. Upon insertion into a reflow oven, the connector 101 can be mounted onto the printed circuit board 2.

Regarding the connector 101, the metal plate 88 has the side surface support portion 88*b*, and therefore, through the use of this side surface support portion 88*b*, the connector 101 can be fixed in place with the solder 5. It is possible to facilitate the fixing with the solder 5 by means of hand working.

INDUSTRIAL APPLICABILITY

The present invention relates to connectors that are used for electrical connection inside of various electronic devices such as mobile communications devices, audio visual (AV) devices, on-vehicle electric equipment devices, and electric devices, and that are suitable for applications of mounting in a reflow oven, and therefore is available in the information and communication device industry, the consumer electronic products industry, the on-vehicle electric equipment device industry, and their related industries.

REFERENCE SIGNS LIST

1 magnetic conductor
2 printed circuit board
3 circuit pattern
4 insulating layer
5 solder
11 connector (first embodiment)
   11*a* upper electrode surface
   11*b* lower electrode surface
12 base portion
   12*a* top surface
   12*b* connection projection
   12*c* bottom surface
   12*e* side surface
13 conductive portion
14 metal plate (shape-retaining sheet)
15 connector (first modification of first embodiment)
16 connector (second modification of first embodiment)
   16*a* upper electrode surface
   16*b* lower electrode surface
17 conductive portion
18 metal plate (shape-retaining sheet)
   18*a* through hole
21 connector (second embodiment)
   21*a* upper electrode surface
   21*b* lower electrode surface
22 base portion
   22*a* top surface
   22*b* through hole
   22*c* bottom surface
23 rubber elastic body
   23*a* connection projection
31 connector (third embodiment)
   31*a* top-surface electrode surface
   31*b* bottom-surface electrode surface
32 base portion
   32*a* top surface
   32*b* connection projection
   32*c* bottom surface
   32*e* side surface
33 resin film (shape-retaining sheet)
   33*a* through hole
41 connector (fourth embodiment)
   41*a* top-surface electrode surface
   41*b* bottom-surface electrode surface
42 base portion
   42*a* top surface
   42*b* connection projection
   42*d* connection projection
47 conductive portion
51 connector (fifth embodiment)
   51*a* top-surface electrode surface
   51*b* bottom-surface electrode surface
54 metal plate (shape-retaining sheet)
   54*a* bottom surface support portion
   54*b* side surface support portion
55 connector (modification of fifth embodiment)
56 metal plate
   56*b* side surface support portion
61 connector (sixth embodiment)
   61*a* top-surface electrode surface
   61*b* bottom-surface electrode surface
62 base portion
   62*a* top surface
   62*b* connection projection
   62*c* bottom surface
   62*f* receiving groove
63 resin film (shape-retaining sheet)
   63*a* through hole
   63*b* foldout projection
68 metal plate (shape-retaining sheet)
   68*a* through hole
   68*b* foldout projection
71 connector (seventh embodiment)
   71*a* top-surface electrode surface
   71*b* bottom-surface electrode surface
72 base portion
   72*a* top surface
   72*c* bottom surface
   72*e* side surface
73 resin molded body
   73*a* through hole
   73*b* small through hole
   73*c* bottom surface
   73*d* side surface
74 rubber elastic body
   74*a* main body portion
   74*b* upper covering portion
   74*c* lower covering portion
   74*d* connection projection
78 metal plate
   78*a* bottom surface support portion
   78*b* side surface support portion
79 conductive portion
   79*a* upper orientation conductive portion
   79*b* lower orientation conductive portion
   79*c* metal conductive portion 81 connector (eighth embodiment)
  81a top-surface electrode surface
  81b bottom-surface electrode surface
88 metal plate
  88a bottom surface support portion
  88b side surface support portion
  88c top surface support portion
91 connector (ninth embodiment)
  91a top-surface electrode surface
  91b bottom-surface electrode surface
92 base portion
  92a top surface
  92c bottom surface
  92e side surface
  92g step surface
95 connector (modification of ninth embodiment)
96 base portion
  96a top surface
  96g step surface
98 metal plate
  98c top surface support portion
  98d projection piece
101 connector (tenth embodiment)
  101a top-surface electrode surface
  101b bottom-surface electrode surface

The invention claimed is:

1. A connector, comprising:
an insulating base portion made of a rubber elastic body or made up of the rubber elastic body and a resin material;
a conductive portion passing through the base portion in a thickness direction of the base portion and being made of a conductive particle or a metal pole or made up of both the conductive particle and the metal pole, the conductive portion having one end and the other end brought into contact with members to be connected, respectively, to conductively connect the members to each other; and
a metal plate having
  a first surface, and
  a second surface opposite from the first surface,
  wherein the first surface covers the base portion in a perpendicular direction to the thickness direction, and the second surface is free from the base portion.

2. The connector according to claim 1, wherein a surface of the conductive portion exposed outside is formed to project beyond a surface of the metal plate.

3. The connector according to claim 1, wherein the metal plate extends on a side surface of the base portion.

4. The connector according to claim 1, wherein the metal plate includes a projecting portion projecting into the base portion that separates adjacent conductive portions from each other.

5. The connector according to claim 1, wherein the base portion has one conductive portion in the inside of the base portion.

6. The connector according to claim 1, wherein the metal plate is arranged on and covers an entire bottom surface of the base portion.

7. The connector according to claim 6, wherein the base portion has a plurality of conductive portions arranged in parallel, and the conductive portions are in direct contact with the metal plate.

8. The connector according to claim 1, wherein the metal plate has a through hole, and one end of the conductive portion penetrates the through hole to be exposed on a lower surface of the connector, so that the end of the conductive portion is flush with the metal plate.

9. The connector according to claim 8, wherein the metal plate and the conductive portion are insulated.

10. The connector according to claim 1, wherein the base portion has single conductive portion in the inside of the base portion.

11. The connector according to claim 1, wherein the metal plate extends from one side surface being perpendicular to the first surface of the metal plate to an other side surface being opposite to the one side surface.

* * * * *